US006709923B2

(12) United States Patent
Chung

(10) Patent No.: US 6,709,923 B2
(45) Date of Patent: Mar. 23, 2004

(54) METHOD FOR MANUFACTURING AN ARRAY STRUCTURE IN INTEGRATED CIRCUITS

(75) Inventor: Henry Wei-Ming Chung, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/178,476

(22) Filed: Jun. 25, 2002

(65) Prior Publication Data

US 2003/0235950 A1 Dec. 25, 2003

(51) Int. Cl.[7] .............................................. H01L 21/336
(52) U.S. Cl. ........................ 438/257; 438/510; 438/551
(58) Field of Search ................................ 438/257, 197, 438/153, 258, 289, 309, 381, 392, 393, 510, 551, 514

(56) References Cited

U.S. PATENT DOCUMENTS 4,569,120 A * 2/1986 Stacy et al. ................... 29/574
5,060,190 A * 10/1991 Chen et al. ................. 365/104
6,166,943 A * 12/2000 Wang et al. .................. 365/94

* cited by examiner

*Primary Examiner*—David Nhu
(74) *Attorney, Agent, or Firm*—Lowe Hauptman Gilman & Berner LLP

(57) ABSTRACT

The present invention discloses a method for manufacturing an array structure in integrated circuits (IC). The method for manufacturing an array structure in integrated circuits of the present invention is performed by using two masks. First, a first mask having array pattern of holes is used to perform a first exposing step with a partial dose, and a second mask having code patterns is used to perform a second exposing step with a compensating dose for the first exposing step, so that a photoresist covering the regions of the holes desired to be opened obtains a sufficient exposure dose and the holes desired are formed by developing. Therefore, a preferred resolution and a preferred depth of focus (DOF) for exposure are obtained, thereby reducing optical proximity effect (OPE), and it is quite easily to manufacture the masks used in the present invention.

19 Claims, 7 Drawing Sheets

200

| | | | | | | | | | | |
|---|---|---|---|---|---|---|---|---|---|---|
| 1 | 1 | 1 | 1 | 1 | 1 | 1 | 1 | 1 | 1 | 1 |
| 1 | 1 | 1 | 0 | 1 | 1 | 1 | 1 | 1 | 1 | 1 |
| 1 | 1 | 1 | 1 | 1 | 1 | 1 | 1 | 1 | 1 | 1 |
| 1 | 1 | 1 | 0 | 1 | 1 | 1 | 1 | 1 | 1 | 1 |
| 1 | 1 | 1 | 1 | 1 | 1 | 1 | 1 | 1 | 1 | 1 |
| 1 | 1 | 1 | 1 | 1 | 0 | 1 | 0 | 1 | 1 | 1 |
| 1 | 1 | 1 | 1 | 1 | 1 | 1 | 1 | 1 | 1 | 1 |
| 1 | 1 | 1 | 1 | 1 | 0 | 1 | 1 | 1 | 1 | 1 |
| 1 | 1 | 1 | 1 | 1 | 1 | 1 | 1 | 1 | 1 | 1 |
| 1 | 1 | 1 | 0 | 1 | 1 | 1 | 1 | 1 | 1 | 1 |
| 1 | 1 | 1 | 1 | 1 | 1 | 1 | 1 | 1 | 1 | 1 |

METHOD FOR MANUFACTURING AN ARRAY STRUCTURE IN INTEGRATED CIRCUITS

FIELD OF THE INVENTION

The present invention relates to a method for manufacturing an array structure in integrated circuits, and more particularly, to a method for manufacturing an array structure in integrated circuits by selective exposure.

BACKGROUND OF THE INVENTION

Generally, integrated circuits are mainly divided into two categories: logic device and memory, wherein the logic device, such as a microprocessor of a computer, is used to execute logic operations, and the memory is a semiconductor device used for storing data. Memories can be divided roughly into two categories: read only memory (ROM) and random access memory (RAM).

A ROM comprises a plurality of memory cells for storing data, and each of the memory cells comprises a metal oxide semiconductor (MOS) transistor. The data stored in a ROM does not change in either a power-off condition or a power-on condition, since the data stored in a ROM does not get lost when the power is turned off. The ROM can be distinguished as a mask ROM (MROM), a programmable ROM (PROM), an erasable programmable ROM (EPROM) or an electrically erasable programmable ROM (EEPROM), according to the way for writing the data into the ROM.

MROM is one of the most fundamental ROMs. The method for manufacturing a ROM is first to arrange a plurality of MOS transistors in a matrix format on a die, wherein the MOS transistors are regarded as the memory cells for storing data. Then, a programming step comprises a step of transferring a code pattern layout on a mask onto the ROM, and a step of selectively implanting ions into the designated MOS transistors for disabling the implanted MOS transistors, thereby forming a structure of the ROM. Therefore, this ROM is called Mask ROM, since it is formed from a mask.

Referring to FIG. 1 and FIG. 2, FIG. 1 is a schematic diagram of a conventional binary code pattern layout, and FIG. 2 is a schematic diagram of a mask formed according to the binary code pattern layout shown in FIG. 1. A binary code pattern layout 100 composed of codes "1" and codes "0" is arranged in a matrix format, and the locations of the codes "1" and the codes "0" correspond to memory cell regions on a mask 102, i.e. the locations of the codes "0" correspond to transparent regions 104 of the mask 102, and the locations of the codes "1" correspond to opaque regions 106 of the mask 102.

Referring to FIG. 3 to FIG. 5, FIG. 3 to FIG. 5 are schematic diagrams of a conventional method for writing the binary code pattern layout shown in FIG. 1 into a ROM. As shown in FIG. 3, a ROM 122 is located on a predetermined area of a die 120, and the ROM 122 comprises a plurality of memory cells 124 arranged in a matrix format, wherein each of the memory cells comprises a MOS transistor (not shown). When writing the binary code pattern layout shown in FIG. 1 into the ROM 122, a photoresist layer 126 is first formed and covers on the ROM 122. Then, a mask 102 formed according to the binary code pattern layout 100 is used to perform a photolithography process, so that the patterns on the mask 102 are transferred onto the ROM 122, wherein cell regions of the mask 102 correspond to the memory cells 124 of the ROM 122. Consequently, after the photolithography process, the locations of the memory cells 124 on the ROM 122 corresponding to the locations of the opaque regions 106 of the mask 102 are still covered by the photoresist layer 126, as shown in FIG. 4.

Sequentially, an ion implantation step is performed to implant ions into the memory cells 124 not covered with the photoresist layer 126, so that ion implantation regions 128 are formed, and the remainder of the photoresist layer 126 is removed, as shown in FIG. 5. Since the threshold voltages of the MOS transistors in the ion implantation regions 128 are raised, the MOS transistors in the ion implantation regions 128 have a different threshold voltage. At this time, the ROM 122 matching the binary code pattern layout 100 is completed.

However, with need of increasing device integration, device size continued to be reduced. When an exposing step of a photolithography process is performed with the mask 102, the resolution of a transferred pattern is reduced due to the influence of the optical proximity effect (OPE). In order to enhance the resolution of the transferred pattern, an illuminant having a shorter wavelength is selected to be an exposing illuminant. However, the illuminant having a shorter wavelength would reduce the depth of focus (DOF), so that the code pattern layout on the mask 102 cannot be transferred onto the ROM 122 effectively and successfully, and the binary code pattern layout 100 also cannot be written into the ROM 122.

Currently, another conventional method for writing a set of binary codes into a ROM has been disclosed in the U.S. Pat. No. 6,166,943. By applying this method to write a set of binary codes into a ROM, two masks and two photoresist layers are used to increase the success rate for writing the set of binary codes into the ROM. The two masks mentioned above, however, are all critical masks and the resolution enhancement technologies (RET) have to be used together in the process. The process of manufacturing the two critical masks is very complicated and difficult, so that it takes more time and more costly. In addition, two photoresist layers used in the method not only increases the process time and the complexity of the process, but also increases the cost; as a result, better alternative are required.

SUMMARY OF THE INVENTION

According to the aforementioned conventional method for manufacturing an array structure in integrated circuits, transferred patterns having good resolution and sufficient DOF cannot be obtained while writing code patterns into a ROM, so that the codes cannot be written into the ROM successfully. In addition, two masks used in the method introduced to obtain a preferred resolution and a deeper DOF are quite complicated and difficult to be manufactured, and the process for manufacturing the masks needs more cost and time. Thus, the method cannot fill the process needs.

Therefore, one object of the present invention is to provide a method for manufacturing an array structure in integrated circuits. The present invention uses a first mask and a partial dose to perform a first exposing step, and uses a second mask and a compensating dose to perform a second exposing step, so as to fully expose the pattern regions needed to be opened. Hence, the OPE can be reduced, and the resolution can be enhanced, and the DOF can be increased, so that the accuracy for writing codes into a ROM in integrated circuits can be raised.

Another object of the present invention is to provide a method for manufacturing an array structure of a ROM. In the method of the present invention, a first exposing step is performed by using a first mask and a partial exposure dose to partially expose holes of the array structure in a ROM, thereby forming a semi-finished product. After a client's order is received, a second mask having a desired code pattern is then formed, and used with an exposure dose compensating the insufficient dose in the first exposing step to perform a second exposing step, thereby writing codes into a ROM. With the application of the present invention, the whole process of a ROM is not changed substantially in accordance with the difference of products, and only needs to replace the second mask. Thus, the time for manufacturing a ROM is reduced greatly, and the present invention is very suitable for mass production.

A further object of the present invention is that the usage of photoresist is decreased as to lower the process cost and reduce the process time, because only a photoresist layer is needed in the process for manufacturing an array structure of a ROM.

According to the aforementioned objects, the present invention further provides a method for manufacturing an array structure in integrated circuits, and the method for manufacturing an array structure in integrated circuits is applied in writing an array layout into a ROM in an integrated circuit. In the method, a photoresist layer is first formed to cover the ROM, and a first mask is used to perform a first exposing step on the photoresist layer with a partial exposure dose, so as to transfer the first type cell regions and the second type cell regions on the first mask onto the photoresist layer. On the first mask, a plurality of first type cell regions and a plurality of second type cell regions are formed thereon, and the locations of the first type cell regions and the locations of the second type cell regions correspond to a plurality of memory cells of the ROM. Then, a second mask is used to performing a second exposing step on the photoresist layer with a compensating exposure dose, so as to transfer the array layout on the second mask onto the photoresist layer. On the second mask, the array layout comprising a plurality of first type cell regions and a plurality of second type cell regions is formed thereon, and the locations of the first type cell regions and the locations of the second type cell regions correspond to the memory cells of the ROM. Subsequently, a developing step is performed to remove part of the photoresist layer and to expose part of the memory cells. After the developing step, an ion implantation step is performed to implant a plurality of ions into the exposed memory cells, and then the other part of the photoresist layer is removed to complete the present invention. In another embodiment of the present invention, the ion implantation step can be replaced with an etching step to remove the exposed memory cells.

By using the first mask and the partial exposure dose to perform the first exposing step, and the second mask and the exposure dose compensating the insufficient in the first exposing step to perform the second exposing step, the OPE of the exposing step can be improved, thereby increasing the resolution and the DOF.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a method for manufacturing an array structure in integrated circuits. In the method of the present invention, two masks are used, and two exposing steps are performed on the same photoresist covering ROMs in integrated circuits, so as to write a set of desired codes into a ROM correctly and form a desired ROM array. In order to make the illustration of the present invention more explicit and complete, the following description and the drawings in the FIG. 6 to FIG. 13 will be referenced.

Figure 1:
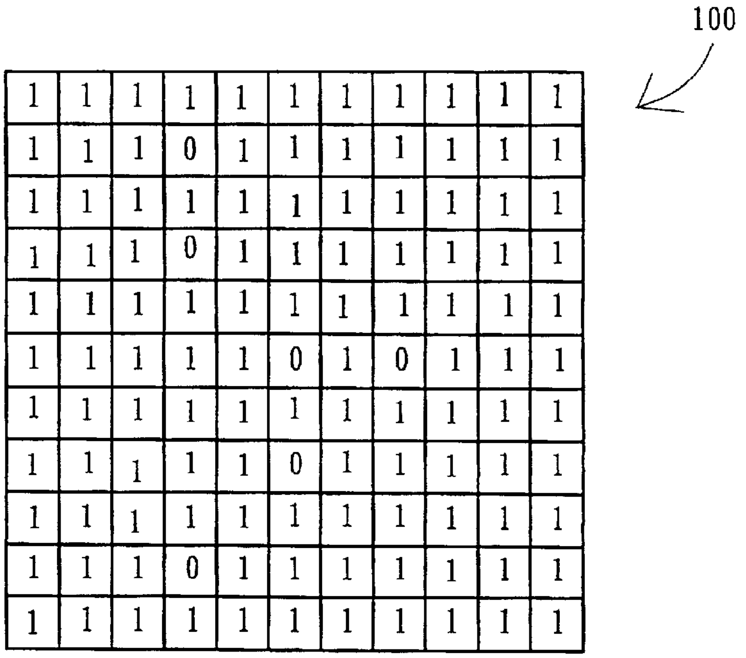
FIG. 1 (PRIOR ART)
FIG. 1 is a schematic diagram of a conventional binary code pattern layout.
Figure 2:
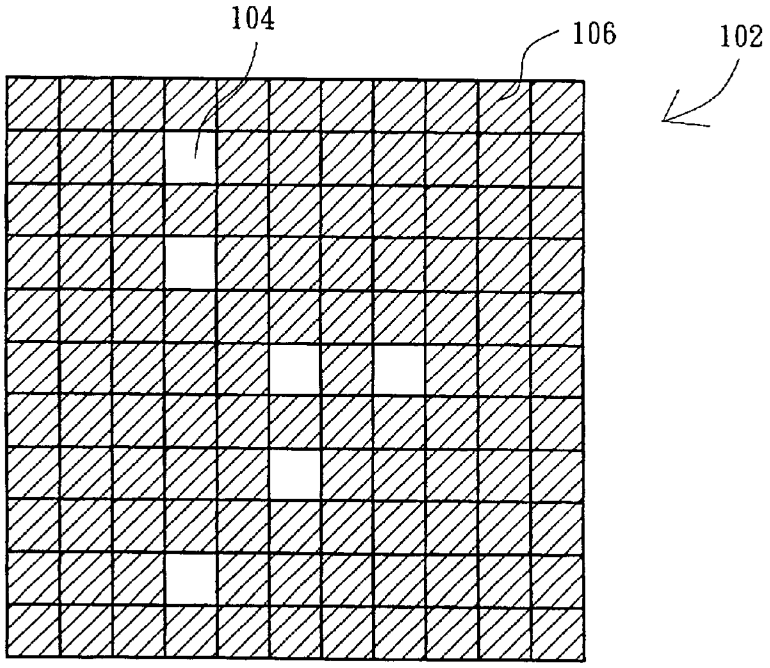
FIG. 2 (PRIOR ART)
FIG. 2 is a schematic diagram of a mask formed according to the binary code pattern layout shown in FIG. 1.
Figure 3:
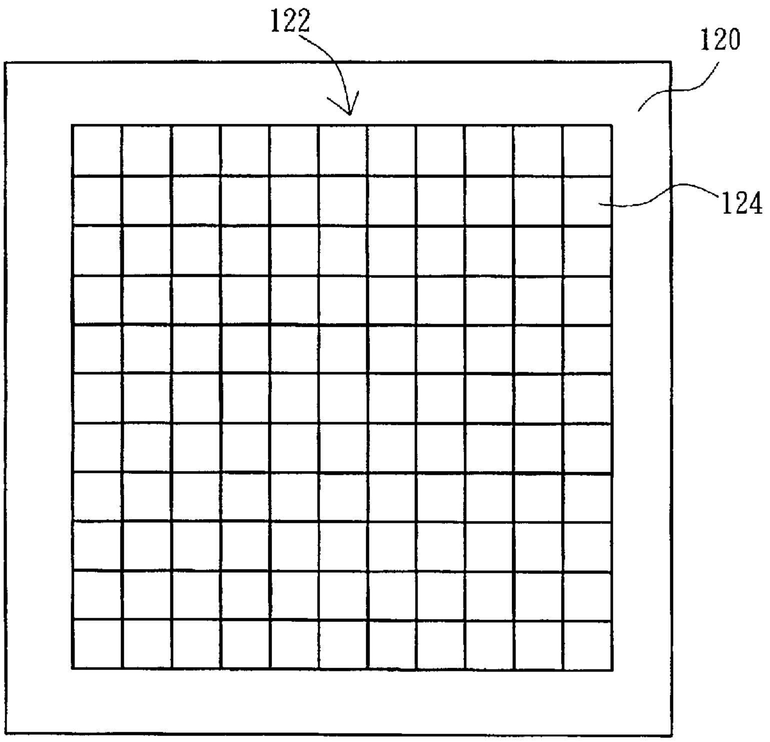
FIG. 3 (PRIOR ART)
FIG. 3 to FIG. 5 are schematic diagrams of a conventional method for writing the binary code pattern layout shown in FIG. 1 into a ROM.
Figure 4:
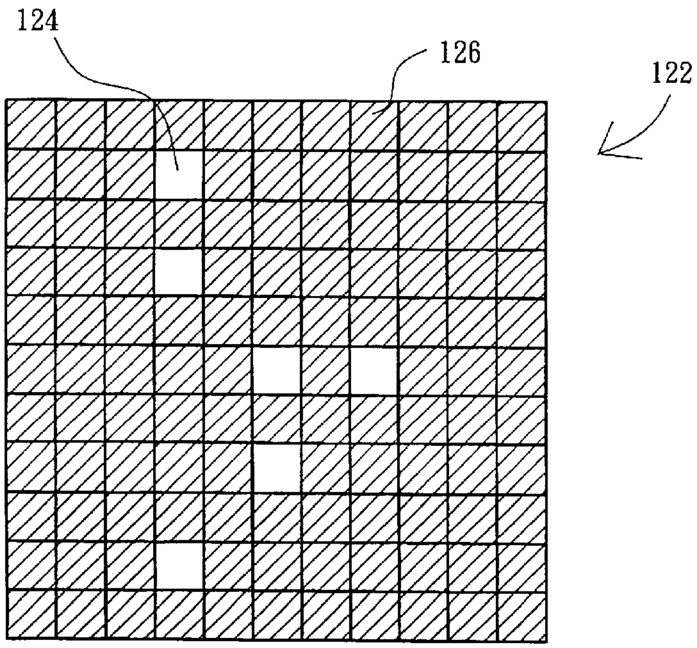
FIG. 4 (PRIOR ART)
Figures 5, 6:
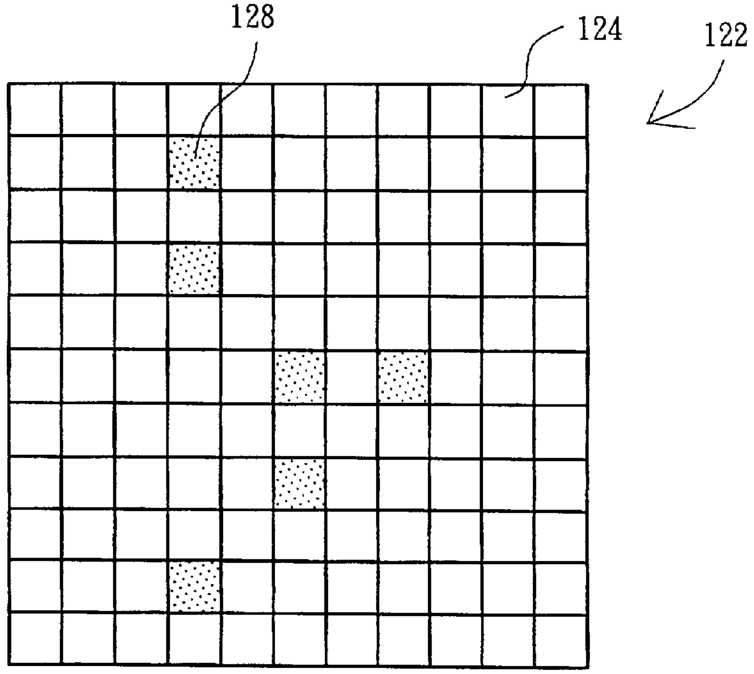
FIG. 5 (PRIOR ART)
FIG. 6 is a schematic diagram of a binary code pattern layout in accordance with a preferred embodiment of the present invention.

Referring to FIG. 6, FIG. 6 shows a schematic diagram of a binary code pattern layout in accordance with a preferred embodiment of the present invention, wherein the binary code pattern layout is an array layout of a memory. A binary code pattern layout 200 in a preferred embodiment of the present invention is the same as the conventional binary code pattern layout 100, wherein the binary code pattern layout 200 is used to describe rather than to limit the present invention. The binary code pattern layout 200 is composed of a plurality of the codes "1" and a plurality of the codes "0" arranged in a matrix format. When the binary code pattern layout 200 is transferred to a memory of an integrated circuit, it means that an array layout of the memory is transferred to the memory, thereby forming an array structure of the memory.

Figure 7:
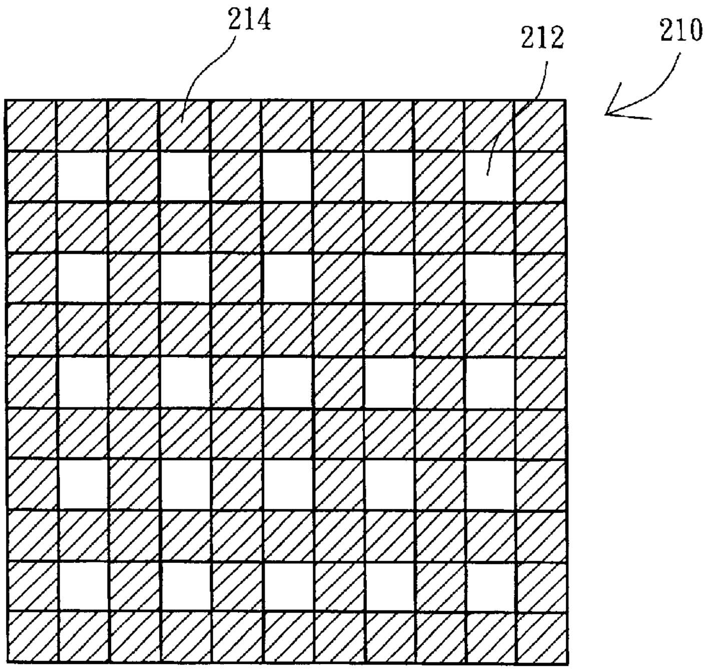
FIG. 7 is a schematic diagram of a first mask in accordance with a preferred embodiment of the present invention.

Referring to FIG. 7, FIG. 7 shows a schematic diagram of a first mask in accordance with a preferred embodiment of the present invention. A first mask 210 in the present invention comprises a plurality of first type cell regions 212 and a plurality of second type cell regions 214, wherein the first type cell regions 212 and the second type cell regions 214 are arranged in a matrix format, and the first type cell regions 212 are transparent regions, and the second type cell regions 214 are opaque regions. In addition, the locations of the first type cell regions 212 and the second type cell regions 214 correspond to the memory cells 244 of a ROM 242 (shown in FIG. 9).

Figure 8:
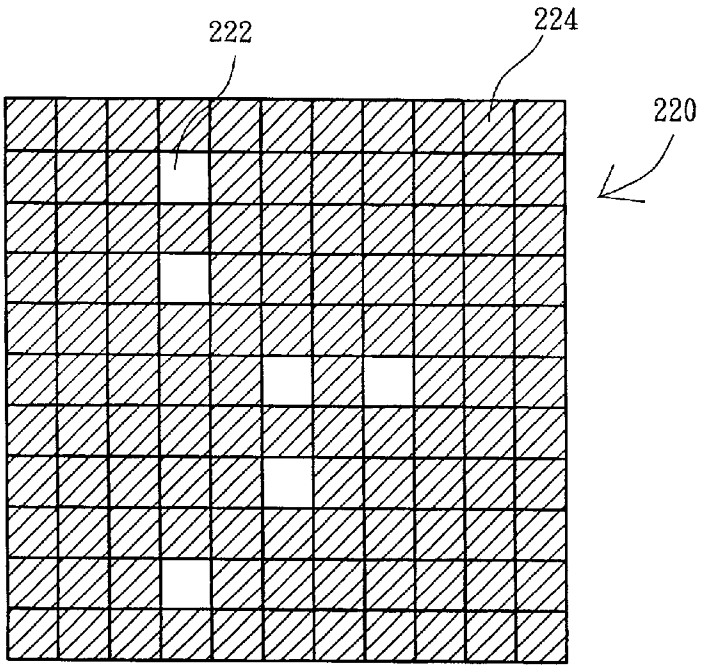
FIG. 8 is a schematic diagram of a second mask in accordance with a preferred embodiment of the present invention, wherein the second mask is formed according to the binary code pattern layout shown in FIG. 6.

Referring to FIG. 8, FIG. 8 shows a schematic diagram of a second mask in accordance with a preferred embodiment of the present invention, and the second mask is formed according to the binary code pattern layout shown in FIG. 6. A second mask 220 in the present invention comprises a plurality of first type cells regions 222 and a plurality of second type cells regions 224, wherein the first type cell regions 222 and the second type cell regions 224 are arranged in a matrix format, and the first type cell regions 222 correspond to the codes "0" of the binary code pattern layout 220 shown in FIG. 6, and the second type cell regions 224 correspond to the codes "1" of the binary code pattern layout 220. That is to say, the second mask 220 has a code layout of the ROM 242 in the present invention formed thereon. In addition, the locations of the first type cell regions 222 and the second type cell regions 224 correspond to the memory cells 244 of the ROM 242, and the first type cell regions 222 are transparent regions, and the second type cell regions 224 are opaque regions.

Figure 9:
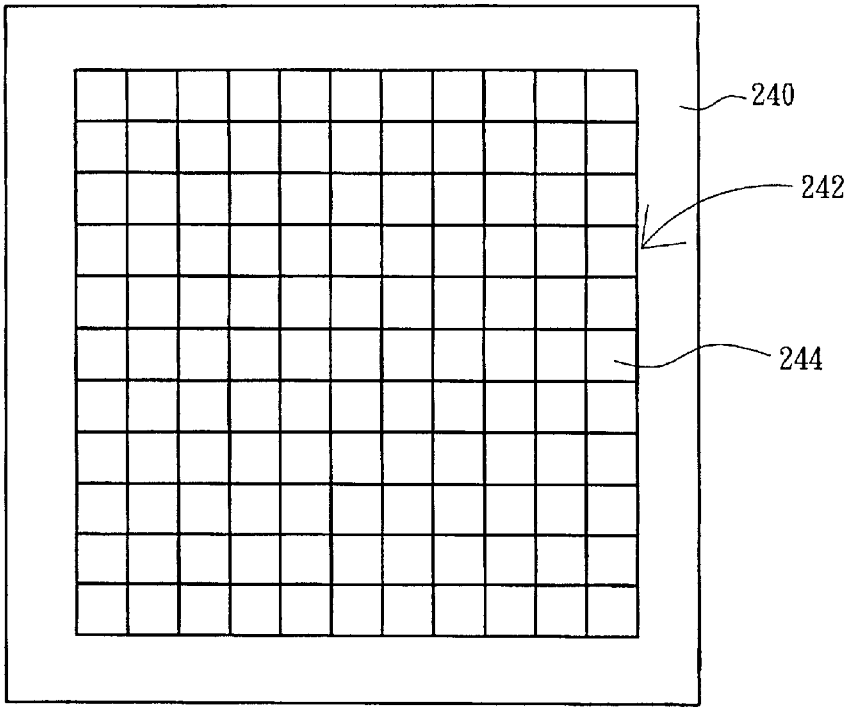
FIG. 9 to FIG. 13 are schematic diagrams of a method for writing the binary code pattern layout shown in FIG. 6 into a ROM in accordance with a preferred embodiment of the present invention.

Referring to FIG. 9 to FIG. 13, FIG. 9 to FIG. 13 show schematic diagrams of a method for writing the binary code pattern layout shown in FIG. 6 into a ROM in accordance with a preferred embodiment of the present invention, when taken in conjunction with the accompanying drawings in FIG. 6, FIG. 7, and FIG. 8. A ROM 242 on a die 240 shown in FIG. 9 is not written with data. The ROM 242 comprises a plurality of memory cells 244, wherein each of the memory cells 244 comprises a MOS transistor (not shown), and the locations of these memory cells 244 correspond to the first type cell regions 212 and second type cell regions 214 in the first mask 210, and the first type cell regions 222 and second type cell regions 224 in the second mask 220.

Figure 10:
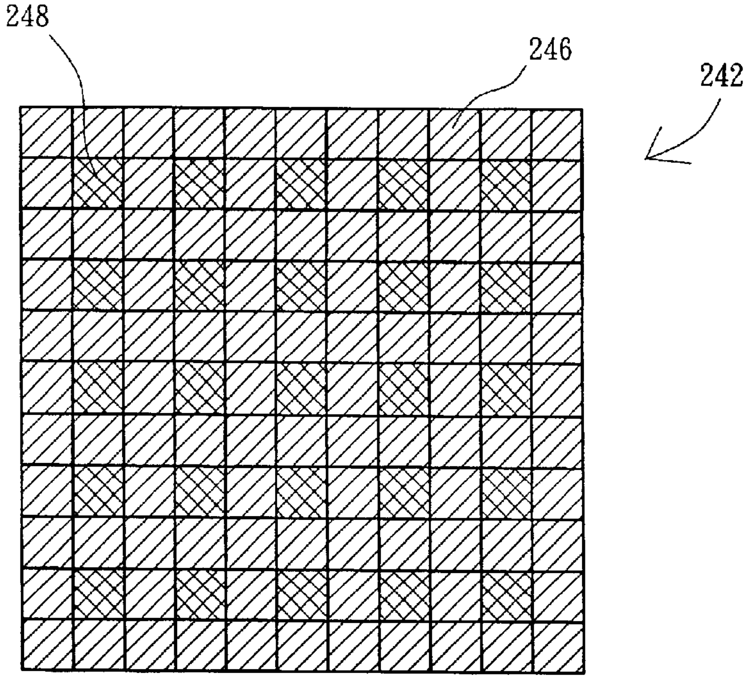

When the binary code pattern layout 200 is written into the ROM 242 to form a desired array structure, a photoresist layer 246 is first formed to cover the memory cells 244 of the ROM 242. Then, for example, an exposing step of a photolithography process with a partial exposure dose and a first mask 210 are used to perform a first exposing step on the photoresist layer 246, so that a plurality of partially exposed regions 248 are formed in the photoresist layer 246, as shown in FIG. 10, wherein the locations of the partially exposed regions 248 correspond to the first type cell regions 212, i.e. transparent regions, in the first mask 210.

Figure 11:
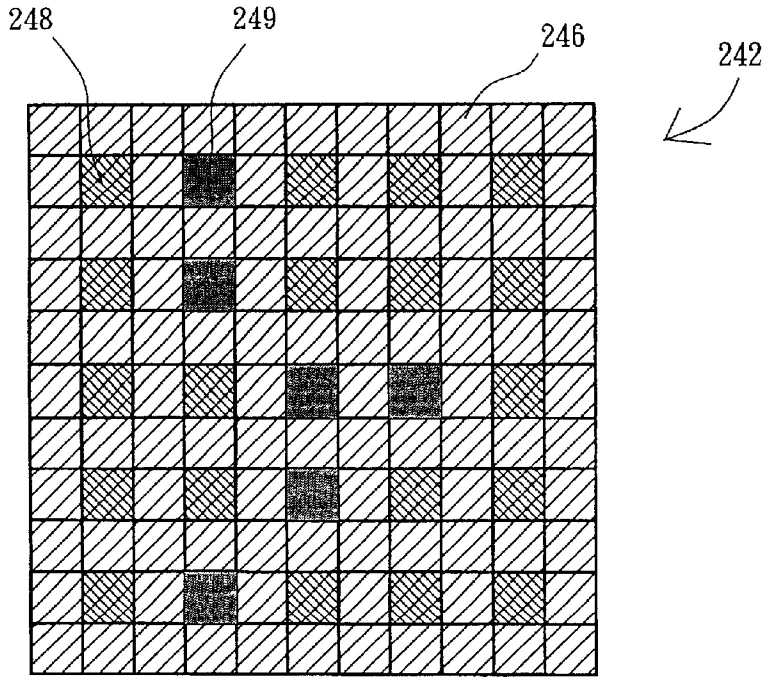
Figure 12:
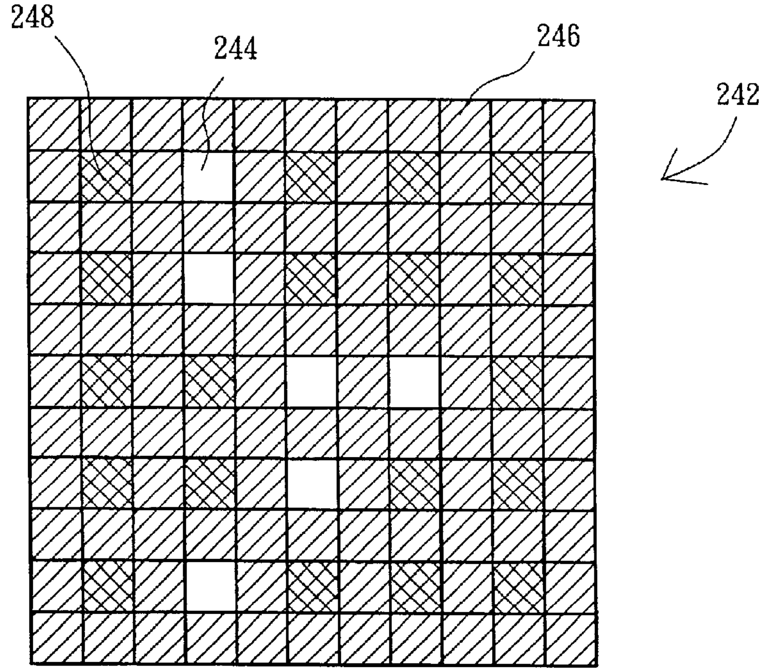

After that, for example, an exposing step of a photolithography process with an exposure dose compensating the insufficient dose in the first exposing step and a second mask 220 are used to perform a second exposing step on the photoresist layer 246, so that a plurality of fully exposed regions 249 are formed in the photoresist layer 246, as shown in FIG. 11, wherein the locations of the fully exposed regions 249 correspond to the first type cell regions 222, i.e. transparent regions, in the second mask 220. A developing step is performed on the photoresist layer 246 to remove the photoresist covering the fully exposed regions 249, so as to expose the memory cells 244 located under the fully exposed regions 249, as shown in FIG. 12.

However, the sequence of the first mask 210 and the second mask 220 can change, and does not limit to the aforementioned description. Alternatively, in the present invention, the first exposing step can also be performing by using the second mask 220 with a partial exposure dose, while the second exposing step is performing by using the first mask 210 with an exposure dose compensating the insufficient dose in the first exposing step.

Figure 13:
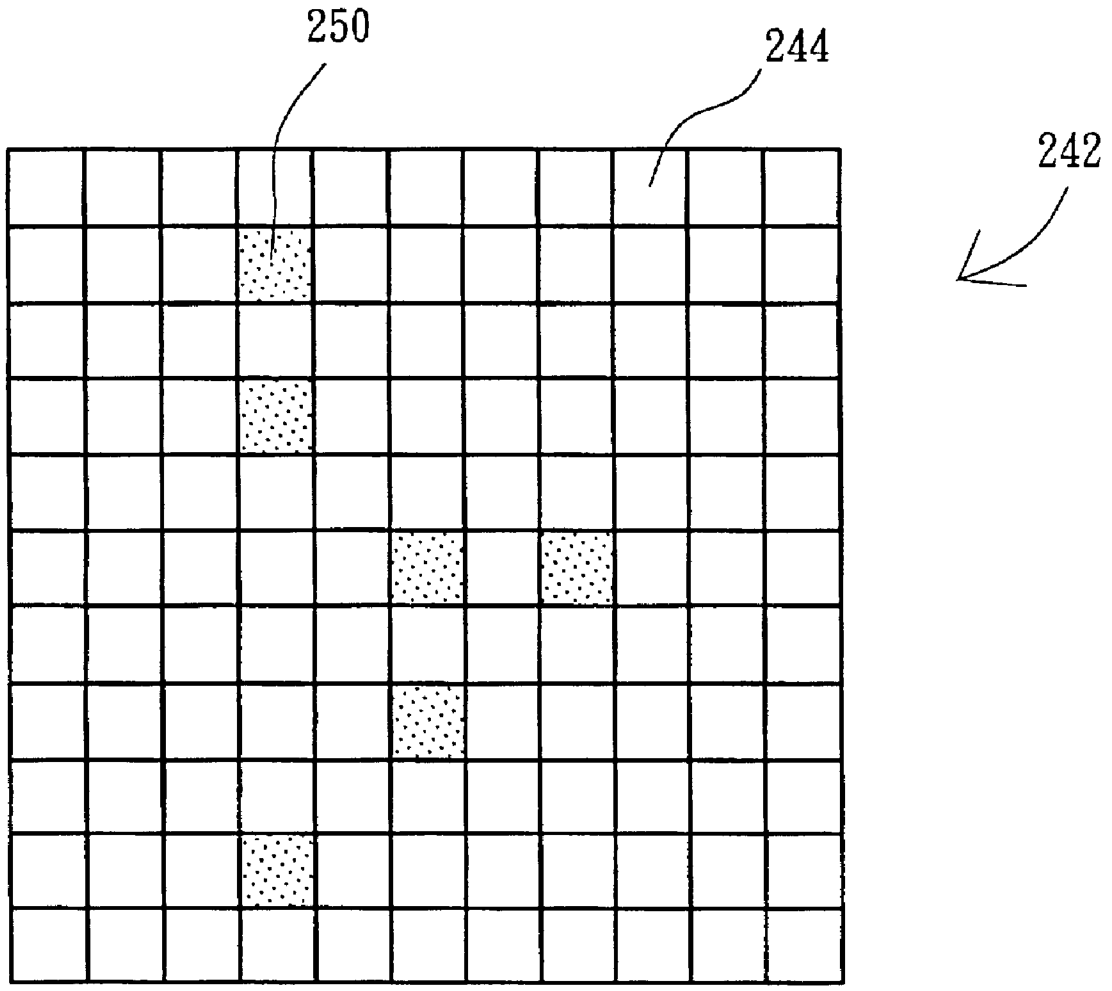

After the photoresist covering the fully exposed regions 249 is removed completely, a sequent treatment, such as an ion implanted step or an etching step, is performed on the exposed memory cells 244. As the sequent treatment is the ion implantation step, ions, such as boron (B), are implanted into the exposed memory cells 244, so as to make each of the exposed memory cells 244 become an ion implanted region 250, as shown in FIG. 13. As the result of the ions implanting, the gate threshold voltage of each MOS transistor of the memory cells 244 in ion implanted regions 250 is raised and becomes disabled. Besides, as the sequent treatment is the etching step,.the exposed memory cells 244 are removed directly by using the etching step. After the exposed memory cells 244 become disabled, the other part of photoresist is removed to complete the array structure of the ROM.

An advantage of the present invention is to provide a method for manufacturing an array structure in integrated circuits. The present invention uses a first mask and a partial exposure dose to perform a first exposing step, and uses a second mask and an exposure dose compensating the insufficient in the first exposing step to perform a second exposing step, so that parts of the memory cells are opened, and the opened memory cells are removed to form a desired array structure. Therefore, the OPE of the exposing step is reduced, and the resolution and the DOF are improved, thereby enhancing the accuracy for writing a set of codes into a ROM in integrated circuits, and obtaining a correct array structure.

Another advantage of the present invention is to provide a method for manufacturing an array structure of a ROM. In the method of the present invention, a first exposing step is performed by using a first mask and a partial exposure dose to partially expose a part of the array structure in a ROM, thereby forming a semi-finished product. When a client's order is received, a second mask having a desired code pattern is then formed and used with an exposure dose compensating the insufficient dose in the first exposing step to perform a second exposing step, so that codes are written into a ROM, and the ROM is programmed rapidly. In addition, the process of a ROM is not changed substantially with the difference of storing data, but only needs to replace the second mask. Therefore, the time for manufacturing a ROM can be reduced greatly.

A further advantage of the present invention is because that, in the process for manufacturing an array structure of a ROM, only a layer of the photoresist for writing codes into the ROM is needed. Therefore, the use of the photoresist is decreased, thereby reducing the process cost and the process time.

As is understood by a person skilled in the art, the foregoing preferred embodiments of the present invention are illustrations of the present invention rather than limitations of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing an array structure in integrated circuits is applied to write an array layout into a read only memory (ROM) in an integrated circuit, wherein the ROM comprises a plurality of memory cells, and the method for manufacturing an array structure in integrated circuits comprises:

forming a photoresist layer to cover the ROM, providing a first mask, wherein the first mask comprises a plurality of first type cell regions and a plurality of second type cell regions;

performing a first exposing step on the photoresist layer by using a partial exposure dose and the first mask;

providing a second mask, wherein the second mask comprises the array layout, and the array layout comprises a plurality of first type cell regions and a plurality of second type cell regions;

performing a second exposing step on the photoresist layer by using a compensating exposure dose and the second mask to form a plurality of fully exposed regions in the photoresist layer, wherein the locations of the fully exposed regions correspond to the first type cell regions of the array layout;

performing a developing step to remove the photoresist layer on the fully exposed regions and expose the memory cells on the fully exposed regions;

performing an ion implantation step to implant a plurality of ions into the exposed memory cells; and removing the remaining part of the photoresist layer.

2. The method according to claim 1, wherein the array layout is formed according to a set of binary codes.

3. The method according to claim 1, wherein each of the memory cells comprises a metal oxide semiconductor (MOS) transistor.

4. The method according to claim 1, wherein the memory cells are arranged in a matrix format.

5. The method according to claim 1, wherein the first type cell regions in the first mask and the first type regions in the second mask are a plurality of transparent regions.

6. The method according to claim 1, wherein the second type cell regions in the first mask and the second type cell regions in the second mask are a plurality of opaque regions.

7. The method according to claim 1, wherein the locations of the first type cell regions and the second type cell regions in the first mask correspond to the memory cells of the ROM.

8. The method according to claim 1, wherein the locations of the first type cell regions and the second type cell regions in the second mask correspond to the memory cells of the ROM.

9. The method according to claim 1, wherein the second exposing step further comprises a step of transferring the array layout in the second mask onto the photoresist layer.

10. A method for manufacturing an array structure in integrated circuits is applied to write an array layout into a read only memory (ROM) in an integrated circuit, wherein the ROM comprises a plurality of memory cells, and the method for manufacturing an array structure in integrated circuits comprises:

forming a photoresist layer to cover the ROM;

performing a first exposing step on the photoresist layer by using a partial exposure dose and a first mask, wherein the first mask comprises a plurality of first type cell regions and a plurality of second type cell regions;

performing a second exposing step on the photoresist layer by using a compensating exposure dose and a second mask to form a plurality of fully exposed regions in the photoresist layer, wherein the second mask comprises the array layout, and the locations of the fully exposed regions correspond to a the first type cell regions in the first mask;

performing an etching step to remove the exposed memory cells; and removing the remaining part of the photoresist layer.

11. The method according to claim 10, wherein th array layout is formed according to a set of binary codes.

12. The method according to claim 10, wherein the array layout comprises a plurality of first type cell regions and a plurality of second type cell regions.

13. The method according to claim 12, wherein the first type cell regions are a plurality of opaque regions.

14. The method according to claim 12, wherein the second type cell regions are a plurality of opaque regions.

15. The method according to claim 10, wherein each of the memory cells comprises a metal oxide semiconductor (MOS) transistor.

16. The method according to claim 10, wherein the memory cells are arranged in a matrix format.

17. The method according to claim 10, wherein the first type cell regions in the first mask are a plurality of transparent regions.

18. The method according to claim 10, wherein the second type cell regions in the first mask are a plurality of opaque regions.

19. The method according to claim 10, wherein the second step further comprises a step of transferring the array layout in the second mask onto the photoresist layer.

* * * * *